(12) United States Patent
Caletka et al.

(10) Patent No.: US 7,703,199 B2
(45) Date of Patent: Apr. 27, 2010

(54) METHOD TO ACCOMMODATE INCREASE IN VOLUME EXPANSION DURING SOLDER REFLOW

(75) Inventors: David Vincent Caletka, Apalachin, NY (US); Krishna Darbha, Johnson City, NY (US); Donald W. Henderson, Ithaca, NY (US); Lawrence P. Lehman, Endicott, NY (US); George Henry Thiel, Endicott, NY (US)

(73) Assignee: International Business Machines Corporation, Armonk, NY (US)

( * ) Notice: Subject to any disclaimer, the term of this patent is extended or adjusted under 35 U.S.C. 154(b) by 236 days.

(21) Appl. No.: 11/440,316

(22) Filed: May 24, 2006

(65) Prior Publication Data

US 2006/0208030 A1    Sep. 21, 2006

Related U.S. Application Data

(60) Continuation of application No. 10/768,836, filed on Jan. 29, 2004, now Pat. No. 7,086,147, which is a division of application No. 09/845,448, filed on Apr. 30, 2001, now Pat. No. 6,686,664.

(51) Int. Cl.
    *H05K 3/30* (2006.01)
(52) U.S. Cl. .................. 29/840; 29/841; 29/855

(58) Field of Classification Search ............ 29/832, 29/836–843, 855; 156/325; 228/179.1, 180.22; 257/737, 772, 774, 777, 778, 787; 361/760, 361/761, 764; 438/551, 612–615, 671, 106
See application file for complete search history.

(56) References Cited

U.S. PATENT DOCUMENTS

| 5,459,287 | A | | 10/1995 | Swamy ..................... 174/266 |
| 5,489,750 | A | * | 2/1996 | Sakemi et al. .............. 29/840 |
| 5,895,229 | A | * | 4/1999 | Carney et al. .............. 438/106 |
| 6,053,397 | A | | 4/2000 | Kaminski .................. 228/254 |
| 6,095,398 | A | | 8/2000 | Takahashi et al. ............ 228/41 |
| 6,121,689 | A | * | 9/2000 | Capote et al. .............. 257/783 |
| 6,208,525 | B1 | * | 3/2001 | Imasu et al. ............... 257/737 |

\* cited by examiner

*Primary Examiner*—Donghai D. Nguyen
(74) *Attorney, Agent, or Firm*—John A. Jordan

(57) ABSTRACT

Solder balls, such as, low melt C4 solder balls undergo volume expansion during reflow. Where the solder balls are encapsulated, expansion pressure can cause damage to device integrity. A volume expansion region in the semiconductor chip substrate beneath each of the solder balls accommodates volume expansion. Air-cushioned diaphragms, deformable materials and non-wettable surfaces may be used to permit return of the solder during cooling to its original site. A porous medium with voids sufficient to accommodate expansion may also be used.

5 Claims, 3 Drawing Sheets

METHOD TO ACCOMMODATE INCREASE IN VOLUME EXPANSION DURING SOLDER REFLOW

This application is a continuation application of divisional application Ser. No. 10/768,836, filed Jan. 29, 2004, issued as U.S. Pat. No. 7,086,147B2, which divisional application is based on parent application Ser. No. 09/845,448, filed Apr. 30, 2001, issued as U.S. Pat. No. 6,686,664.

BACKGROUND OF THE INVENTION

1. Field of the Invention

The present invention relates to methods and structures for attaching a semiconductor chip or chip carrier to a substrate and, more particularly, to methods and structures for attaching a semiconductor chip or chip carrier to a substrate using solder ball technology.

2. Background and Related Art

In the fabrication of electronic devices as, for example, during ball attach or card attach, low melt C4 (controlled collapsed chip connection) solder balls on a chip carrier will reach their melting temperature and become liquid. Typically, for solder with a high tin content, the volume expansion associated with this phase change can range between 3 and 6%. If the C4 solder balls have been encapsulated prior to this volume change, as is typically the case, the volume expansion is constrained and the resulting pressure may result in the squeezing of this expanding volume of liquid into voids present in the surrounding underfill and its associated interfaces. This volume expansion of solder may also result in opening any weak interfaces, like underfill to chip passivation (for example polyimide) or underfill to solder mask interfaces. It is clear that the effect of such action could result in device failure.

SUMMARY OF THE INVENTION

In accordance with the present invention, structures are provided on the chip carrier to relieve pressure created by volume expanding solder upon heating and reflow. The structures are formed directly beneath the solder balls or bumps. The pressure relief structure may be in the form of microchannels or vias, an air cushioned diaphragm, or porous or compressible medium, like foam. The various structures act in a manner to accept or accommodate the expanding or excess volume of solder created during melting to thereby minimize or avoid the creation of pressure that may affect the region adjoining or surrounding the solder balls and the various material interfaces.

Accordingly, it is an object of the present invention to provide improved methods of making connections in electronic devices, to enhance overall reliability of the product.

It is another object of the present invention to provide structures which act to accommodate expanding solder when it changed to the liquid phase.

It is yet another object of the present invention to provide a method of attaching enclosed solder balls to connection pads by providing structures that accommodate expanding solder upon reflow.

It is a further object of the present invention to provide structures that relieve internal pressures in an enclosed electronic packaging environment caused by the expansion of solder when going from the solid to liquid phase.

It is yet a further object of the present invention to provide methods and structures that relieve pressure from solder reflow to thereby prevent damage to material interfaces in electronic devices.

These foregoing and other objects, features and advantages of the invention will be apparent from the following more particular description of a preferred embodiment of the invention, as illustrated in the accompanying drawings, wherein like reference members represent like parts of the invention.

DETAILED DESCRIPTION

Figure 1:
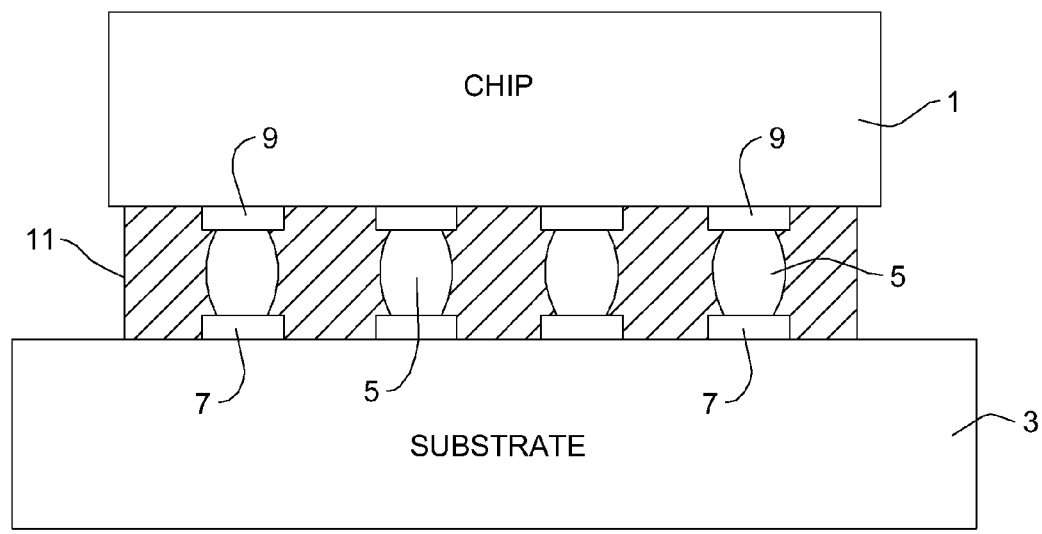
FIG. 1 shows a cross-section of a typical Prior Art arrangement wherein a semiconductor chip is positioned for electrical connection to a substrate through an array of solder balls.

With reference to FIG. 1, there is shown a conventional arrangement of semiconductor chip and substrate. Substrate 3 may be a PCB type of substrate or a ceramic substrate, for example. Substrate 3 may also be a single chip module or a multi chip module (MCM) which is, in turn, attached to a substrate, such as a PCB. Chip 1 is shown positioned on substrate 3 with C4 solder balls or bumps 5, for example, positioned therebetween. Solder balls 5 may, in fact, not be ball shape but may be shaped like bumps or be, very generally, globular in shape. FIG. 1 shows the balls 5 somewhat elongated in shape but slightly truncated at their ends by conductive pads 7 and 9. Thus, the terms "solder balls" or "solder bumps" should not be taken to be limiting in shape but taken to be more as a mass of solder. In this regard, it is clear that connection is not necessarily limited to a C4-type or a flip chip solder connection but may, for example, be a BGA solder interconnect. Typically, solder balls 5 are first attached to conductive pads 7 on substrate 3. Pads 7 may, for example, be copper pads. Chip 1 is then aligned so that its copper pads 9, or other bump limiting metallurgy (BLM) structures, align with solder balls 5.

As further shown in FIG. 1, a layer of insulating material 11 surrounds and encapsulates solder balls 5. Typically, the chip and substrate pads are aligned to solder balls 5 and then the arrangement heated to reflow the solder to make the connection. After connection is made, an underfill is then dispensed between chip and substrate to provide encapsulation of the solder connections and support therefor.

Whatever technique is used to make connections and encapsulate same, it is clear that when encapsulated there is little room for expansion of the solder balls or connections on subsequent single or multiple reflow. Subsequent reflow may occur, for example, when there is subsequent attachment to a PCB, where substrate 3 is a single or MCM, or subsequent attachment to a card. It can also occur during preconditioning.

This problem is particularly severe for low melt single alloy solders. Typically, the volume expansion associated with high tin content solders in going to the liquid phase is 3 to 6%. However, the problem may exist for any of a variety of solder alloys that exhibit high volume expansion (e.g. >3%) on melting and that will encounter additional reflow (melt) temperatures during assembly or preconditioning of the package.

With such volume expansion in an encapsulated environment, the phase change instantaneously produces pressure that may result in the squeezing of the excess volume into voids present in the surrounding underfill or spacer, or produce a hydraulic force acting on the semiconductor chip thus opening or delaminating any weak interfaces, such as, the underfill-polyimide and underfill-solder mask interfaces. In addition, solder bridging, solder migration to interfaces and solder depletion within joints may occur. In this regard, it should be understood that the problems caused by solder volume expansion on reflow also exist with second and subsequent levels of solder interconnects, such as, BGA solder joints that have been underfilled or encapsulated. Accordingly, the teachings of the present invention to solve such problems are equally applicable to second and subsequent levels of packaging. The teachings help in mitigating the above related problems and provides for improving reliability of the electronic product.

Figure 2A:
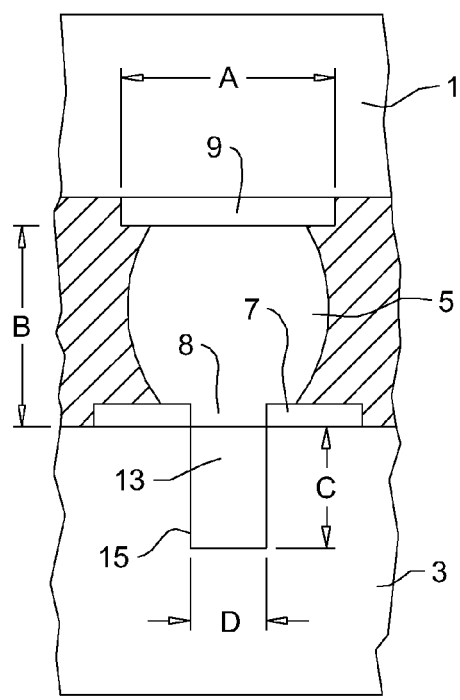
FIG. 2A shows an enlarged section of the arrangement shown in FIG. 1 with one form of structure used to release pressure on reflow of solder balls.

In accordance with the present invention, several structural arrangements are provided to relieve pressure created by volume expansion of solder during reflow. FIG. 2A is enlarged partial section showing one of the solder balls of FIG. 1 with such partial section showing one such structural arrangement for relieving pressure during reflow. Microchannel, cavity or via 13 is shown beneath solder ball 5 to accommodate expanding solder volume during reflow. Connection to other circuitry here is through top surface metallurgy connected to pad 7. In this regard, each of the solder balls in the solder ball array is provided its own independent microchannel or via to facilitate expansion. These microchannels or vias may be, for example, laser drilled by laser ablation through pads 7 (forming hole 8) and into the substrate 3 prior to mounting solder balls and chip to the substrate.

Representative dimensions for a 5% volume expansion of C4 solder balls might be A=140 μm, B=100 μm, C=45 μm and D=25 μm. Such dimensions would typically approximate the maximum volume of the microchannel that is needed to accommodate 5% volume expansion of solder. It should be understood, however, that, in general, the microchannel volume need not necessarily be large enough to accommodate the total volume expansion of the solder but rather the microchannel volume may be optimized to be large enough to sufficiently relieve pressure and limit stress build-up so that it is below the interfacial adhesion strength of the underfill. This, in turn, will depend on the type of underfill and passivation on the die and the choice of solder mask material on the laminate.

Microchannel or via 13, in FIG. 2A, has a non-wettable surface 15 such that during reflow, the excess volume of solder would be forced into microchannel 13 thus relieving the pressure by accommodating the excess volume without affecting the adjoining regions. Then, during cooling the surface tension of the solder would force the solder back up onto copper pad 7 thus regaining its original ball-like shape. It should be understood that the Figures are not to scale and are only generally illustrative of the shapes and sizes and are merely used to facilitate a description and understanding of the invention.

Figure 2B:
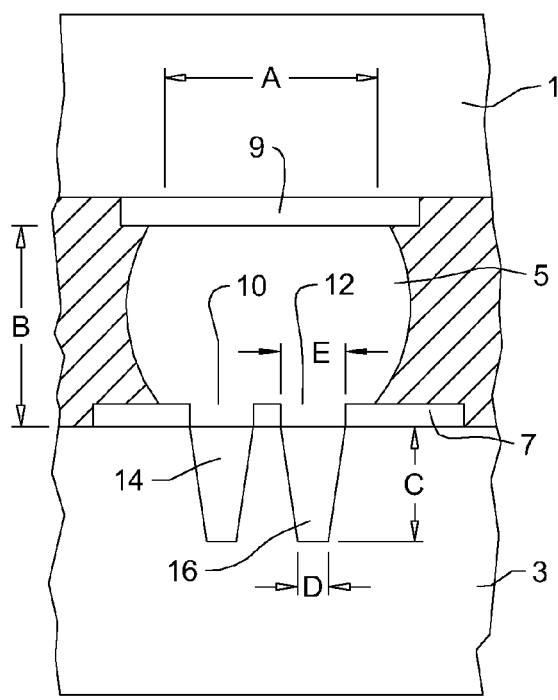
FIG. 2B shows an enlarged section of the arrangement shown in FIG. 1 with a further structure used to release pressure on reflow of solder balls.

FIG. 2B shows a pressure relief structure similar that shown in FIG. 2A but rather than employ a single microchannel or via, multiple microchannels are employed under each solder ball, such as shown at 14 and 16. As in FIG. 2A, holes in pad 7 may be laser ablated and then the microchannels or vias 14 and 16 either ablated or etched into substrate 3. Similar to FIG. 2A, the surfaces of microchannels or vias 14 and 16 may be non-wettable.

Employment of multiple microchannels or vias, as shown in FIG. 2B, would be particularly useful for BGA solder joints, such as, those employed in MCM-L (multi chip module-laminate) and CSP (chip size package) applications that have large contact surface areas. By using multiple microchannels, the microchannel depths may be reduced to achieve the same total volume. Shorter microchannel depths have the advantage of shorter return paths for solder upon solidification. A particularly advantageous shape for the microchannels would be conical, as shown in FIG. 2B, with E>D for each hole. Although two microchannels or vias 14 and 16 are shown in FIG. 2B, it is clear that more than two holes could be employed. Typically, anywhere from 2 to 6 somewhat evenly spaced holes through pad 7 would work well although the number will be somewhat dependent upon the area of the pad surface. It should also be noted, that the single hole 13 in FIG. 2A could also be conical in shape with the larger opening running through pads 7, similar to FIG. 2B.

Figure 3:
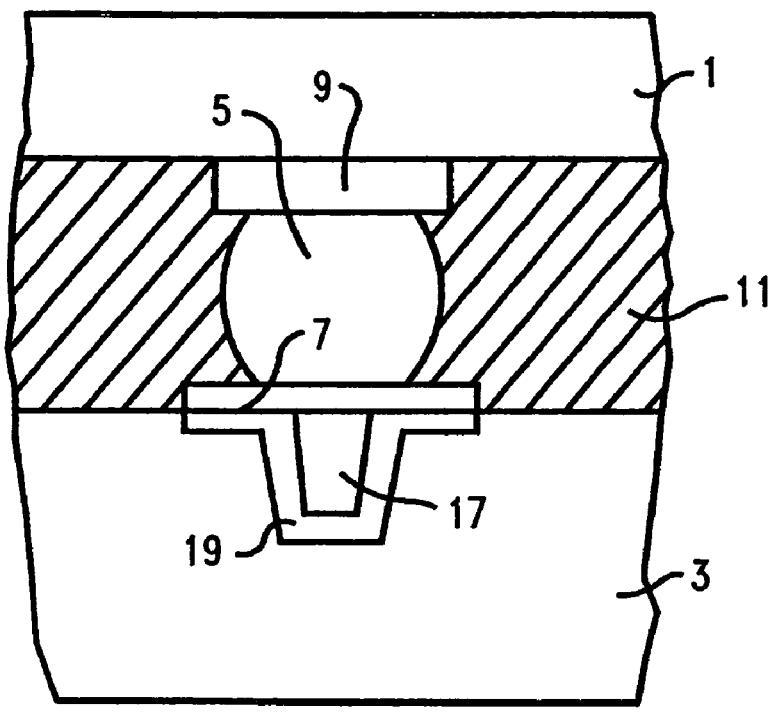
FIG. 3 shows another enlarged section of the arrangement shown in FIG. 1 with an air-cushioned form of structure used to relieve pressure on reflow of solder balls.

FIG. 3 shows another structural arrangement for accommodating solder volume expansion during reflow. In FIG. 3, via or cavity 17 is plated with a layer 19 of conductive material, such as, copper. The plated via 17, shown in contact with pad 7, is used to make connection to other circuitry. Electrical connection can also be made directly to pad 7 from the surface. In this structural arrangement, pad 7 also acts as an air-cushioned diaphragm which functions to accommodate expanding volume of solder into via 17 during reflow. In this regard, pad 7 is sufficiently thin and elastic so as to flex without rupture in response to the expanding volume of solder during reflow and, then, upon cooling return to its original state, as shown.

Figure 4:
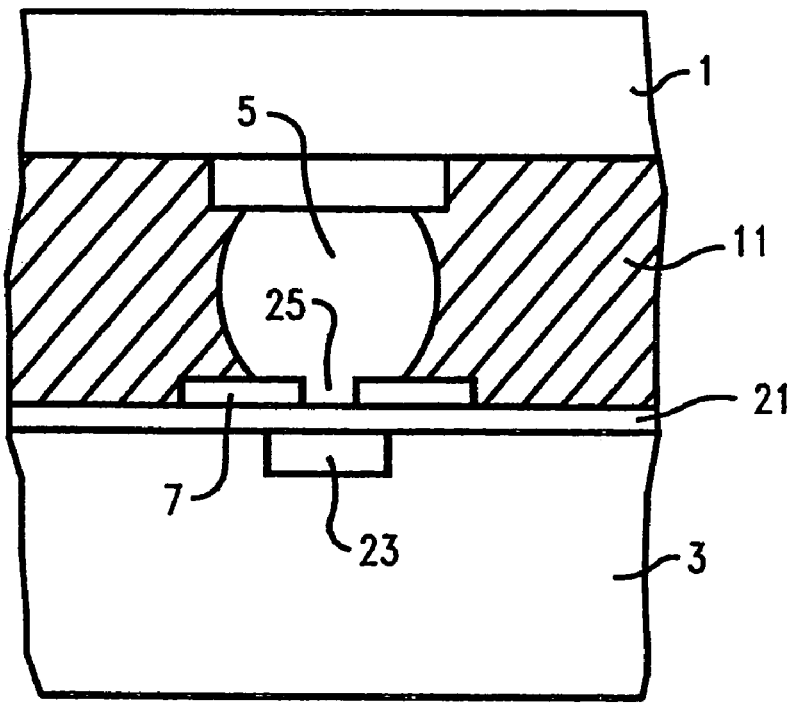
FIG. 4 shows yet another enlarged section of the arrangement shown in FIG. 1 with another air-cushioned form of structure used to relieve pressure on reflow of solder balls.

FIG. 4 shows a further air-cushioned diaphragm arrangement for accommodating excess volume of solder during reflow. In this arrangement, a flexible insulating layer 21, such as polyimide, is used as a diaphragm over cavity 23. A hole or via 25 formed in pad 7 exposes solder ball 5 to layer 21. During reflow of solder ball 5, excess volume of solder acts to depress layer 21 downwardly into cavity 23 to accommodate the expanding volume. During cooling, the volume expanded into the cavity via layer 21 is contracted and the air-cushioned diaphragm returns to its original state, as shown.

Figure 5:
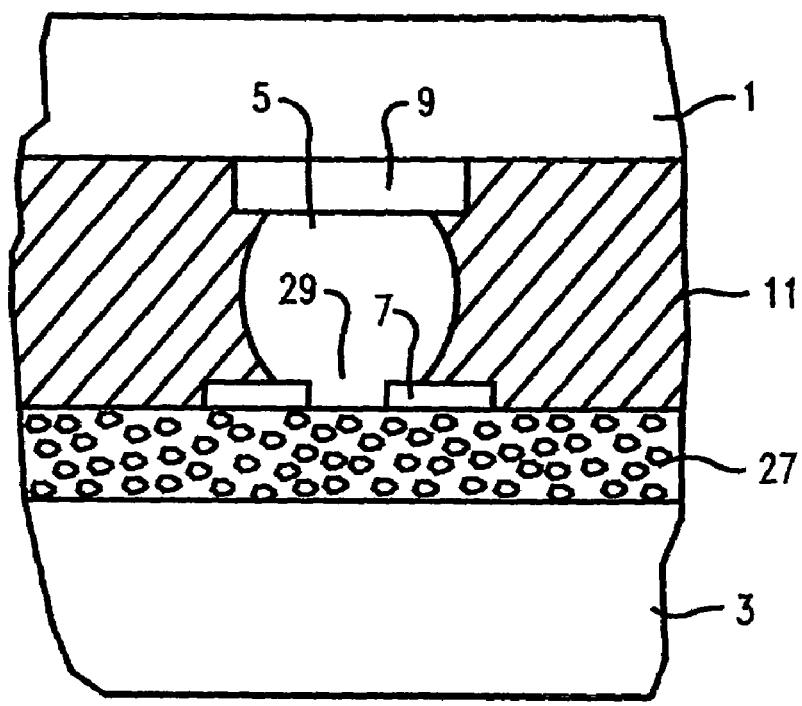
FIG. 5 shows still yet another enlarged section of the arrangement shown in FIG. 1 with a compressible form of structure used to relieve pressure on reflow of solder balls.

FIG. 5 shows yet another structural arrangement for accommodating solder volume expansion during reflow. In FIG. 5, a somewhat porous, deformable layer 27 is exposed to solder ball 5 by way of a hole or aperture 29. Layer 27 has a top surface that is closed and continuous (non-permeable to solder) and compliant. Upon application of heat to reflow solder ball 5, excess solder caused by volume expansion during the liquid phase is forced downwardly through hole 29 causing deformable layer 27 to compress to relieve the resultant pressure. The liquid solder on reflow does not enter into the pores or voids of layer 27 since its top surface is non-permeable. Since compression is local to each cell, each cell is closed off from the others. In addition to having the top surface of layer 27 non-permeable, a thin, flexible, non-permeable membrane may also be formed on its surface. Upon cooling, the liquid solder is drawn back up through hole 29 onto pad 7 to its original position, as shown. This is a result of both surface tension and pressure from the deformable layer. Typical materials that may be used for layer 27 are RO2800

Rogers material with a non-permeable membrane, like polyimide, adhered to the top surface such that it acts as a closed-cell -material. Cellular silicone can also be converted to a closed-cell structure through adhesion of polyimide to its surface. Thicknesses for layer 27 may range from 75 µm to 100 µm.

Figure 6:
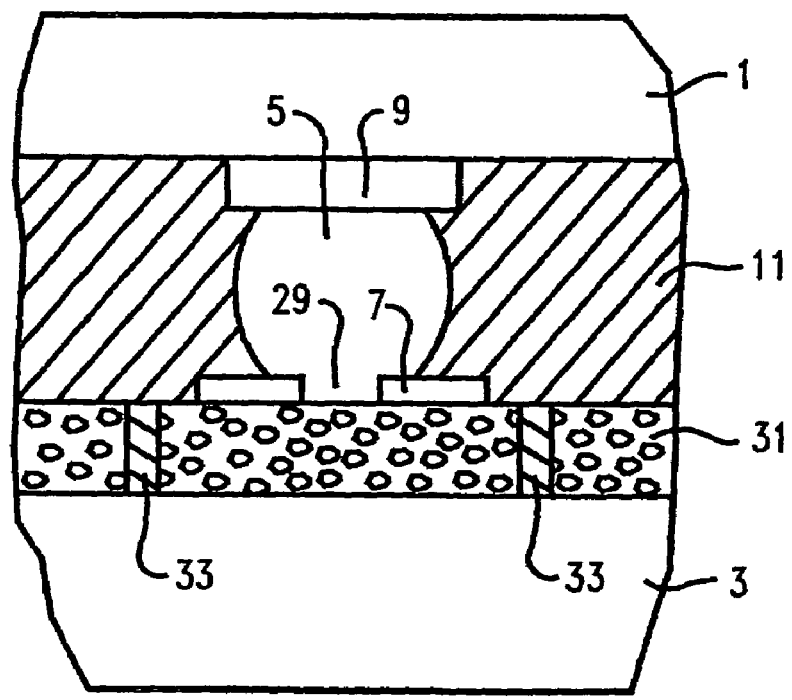
FIG. 6 shows a further enlarged section of the arrangement shown in FIG. 1 with a further porous form of structure used to relieve pressure on reflow of solder balls.

FIG. 6 shows yet a further structural arrangement for accommodating solder volume expansion during reflow. In FIG. 6, a porous, rigid layer 31 is employed, in contrast to the deformable layer 27 in FIG. 5. In the structural arrangement of FIG. 6, when solder ball 5 is subjected to heat to reflow the solder, the volume expansion of the solder in the liquid phase is accommodated by being absorbed into the pores or voids of layer 31. In this regard, the surface of layer 31 is open, i.e., the voids are accessible at the surface portion of the layer exposed to hole 29. Thus, the voids in regard to layer 31 act as pressure relief reservoirs. Layer 31 may be made, for example, of porous ceramic material with non-wettable voids. Again, upon cooling the liquid solder is drawn up through hole 29 to reform on pad 7, as shown.

To ensure that the porous area under solder ball 5 is isolated from the porous areas under adjacent solder balls, isolation trench or region 33 may be formed. Isolation region 33 may be made by forming a trench in rigid layer 31 around the region beneath solder ball 5. The trench may then be back-filled with an isolating material, such as, polyimide or an oxide. The trench may be etched or laser profiled through layer 31 to substrate 3. Isolation region 33 prevents unwanted migration of the solder, absorbed during reflow, from interacting with the solder absorbed during reflow of an adjacent site. Rigid layer 31 may be made of a conventional ceramic material fabricated to exhibit voids. Layer 31 may be 75 µm to 100 µm thick.

Rather than form isolation region 33 in the porous rigid layer 31, the substrate, itself, may be used to form an isolation region. This may be achieved by masking a region of substrate 3 around the site of the solder ball that is to act as the isolation region, and then etching back the substrate inside the region. Thereafter the etched region is backfilled with the porous, rigid material.

It will be understood from the foregoing description that various modifications and changes may be made in the preferred embodiment of the present invention without departing from its true spirit. It is intended that this description is for purposes of illustration only and should not be construed in a limiting sense. The scope of this invention should be limited only by the language of the following claims.

What is claimed is:

1. A method of fabricating electronic devices, comprising: providing an encapsulated solder bump having a top surface portion in electrical contact with a first conductive pad and encapsulated sidewall surface portions extending therefrom to a bottom surface portion in electrical contact with a second conductive pad on a substrate; and
providing said second conductive pad on said substrate with an opening therein extending to a volume expansion region in said substrate with said volume expansion region including a porous material with voids sufficient to accommodate volume expansion of said encapsulated solder bump during solder reflow and thereby prevent damage to the electronic devices.

2. A method of fabricating electronic devices, comprising: providing an encapsulated solder bump having a top surface portion in electrical contact with a first conductive pad and encapsulated sidewall surface portions extending therefrom to a bottom surface portion in electrical contact with a second conductive pad on a substrate; and
providing said second conductive pad on said substrate with an opening therein extending to a volume expansion region in said substrate with said volume expansion region including within said volume expansion region a deformable solid medium that deforms to accommodate volume expansion of said encapsulated solder bump during solder reflow and thereby prevent damage to the electronic devices.

3. A method of fabricating electronic devices, comprising: providing an encapsulated solder bump having a top surface portion in electrical contact with a first conductive pad and encapsulated sidewall surface portions extending therefrom to a bottom surface portion in electrical contact with a second conductive pad on a substrate; and
providing said second conductive pad on said substrate with an opening therein extending to a volume expansion region in said substrate so as to accommodate volume expansion of said encapsulated solder bump during reflow and during cooling said reflowed solder that expands into said volume expansion region is drawn back to said encapsulated solder bump and thereby prevent damage to the electronic devices.

4. The method of claim 3 including the further step of applying heat to cause said encapsulated solder bump to reflow and expand into said volume expansion region.

5. The method of claim 3 wherein said volume expansion region includes an air-cushioned diaphragm that flexes during volume expansion of said solder.

* * * * *